United States Patent [19]
Satoh et al.

[11] Patent Number: 5,146,507
[45] Date of Patent: Sep. 8, 1992

[54] AUDIO REPRODUCTION CHARACTERISTICS CONTROL DEVICE

[75] Inventors: Yuji Satoh; Hiromi Sotome; Yoshiki Fukazawa; Kiyoto Kuroiwa, all of Hamamatsu, Japan

[73] Assignee: Yamaha Corporation, Hamamatsu, Japan

[21] Appl. No.: 482,826

[22] Filed: Feb. 21, 1990

[30] Foreign Application Priority Data

Feb. 23, 1989 [JP] Japan ................. 1-21214[U]
Feb. 23, 1989 [JP] Japan ................. 1-21215[U]

[51] Int. Cl.$^5$ .................. H03G 5/00; H03G 3/00
[52] U.S. Cl. ...................... 381/103; 381/86; 381/63
[58] Field of Search ................. 381/86, 63, 61

[56] References Cited

U.S. PATENT DOCUMENTS

| 4,219,880 | 8/1980 | Nichols ................... 381/63 |
| 4,648,117 | 3/1987 | Kunugi et al. ............ 381/86 |
| 4,903,307 | 2/1990 | Ozawa et al. ............. 381/86 |
| 4,953,219 | 8/1990 | Kasai et al. .............. 381/86 |

FOREIGN PATENT DOCUMENTS 5585190 6/1980 Japan ..................... 381/61

Primary Examiner—Forester W. Isen
Attorney, Agent, or Firm—Spensley Horn Jubas & Lubitz

[57] ABSTRACT

An audio reproduction characteristic control device reproduces various sound fields by producing reflected sounds of a reproduced source signal. Frequency response characteristic correction parameters for correcting a frequency response characteristic which varies with a reproduction environment to a standard characteristic or other predetermined characteristic is prestored in a memory and one of these parameters is read out in accordance with a designated reproduction environment and, if necessary, additionally with a designated sound field whereby the frequency response characteristic is corrected. In another aspect of the invention, reflected sound signals for front left, front right, rear left and rear right positions of a designated sound field are generated by operating input source signals with reflected sound characteristic parameters and these reflected sound signals are added to the source signals to be propagated from four directions in a space inside of an automobile. An impression of presence in the automobile thereby is improved.

10 Claims, 11 Drawing Sheets

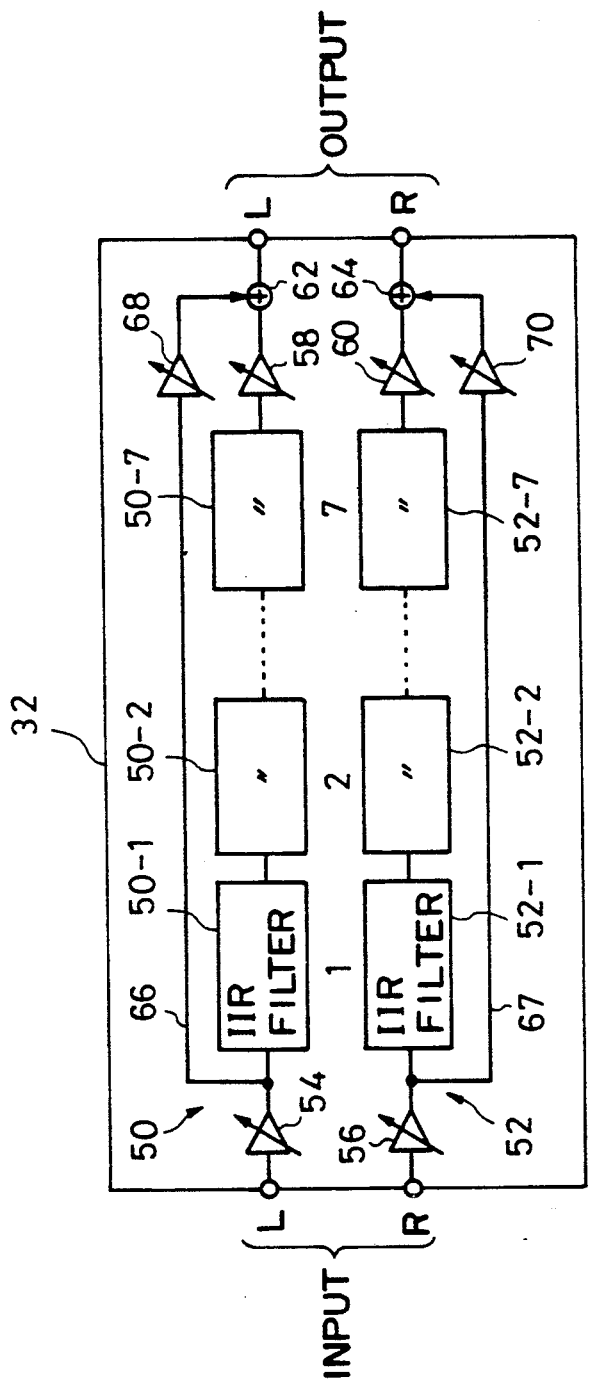
F I G. 3

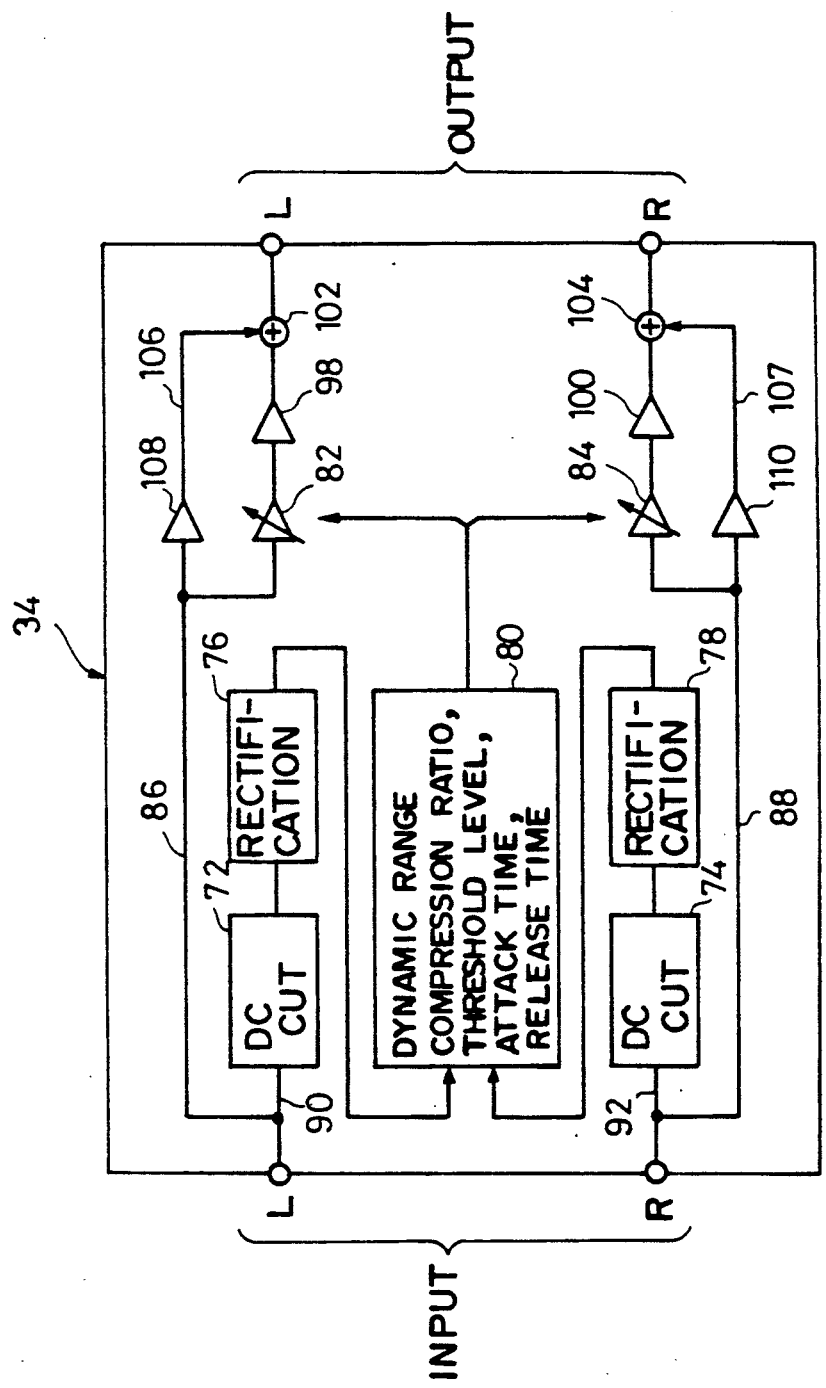
F I G. 5

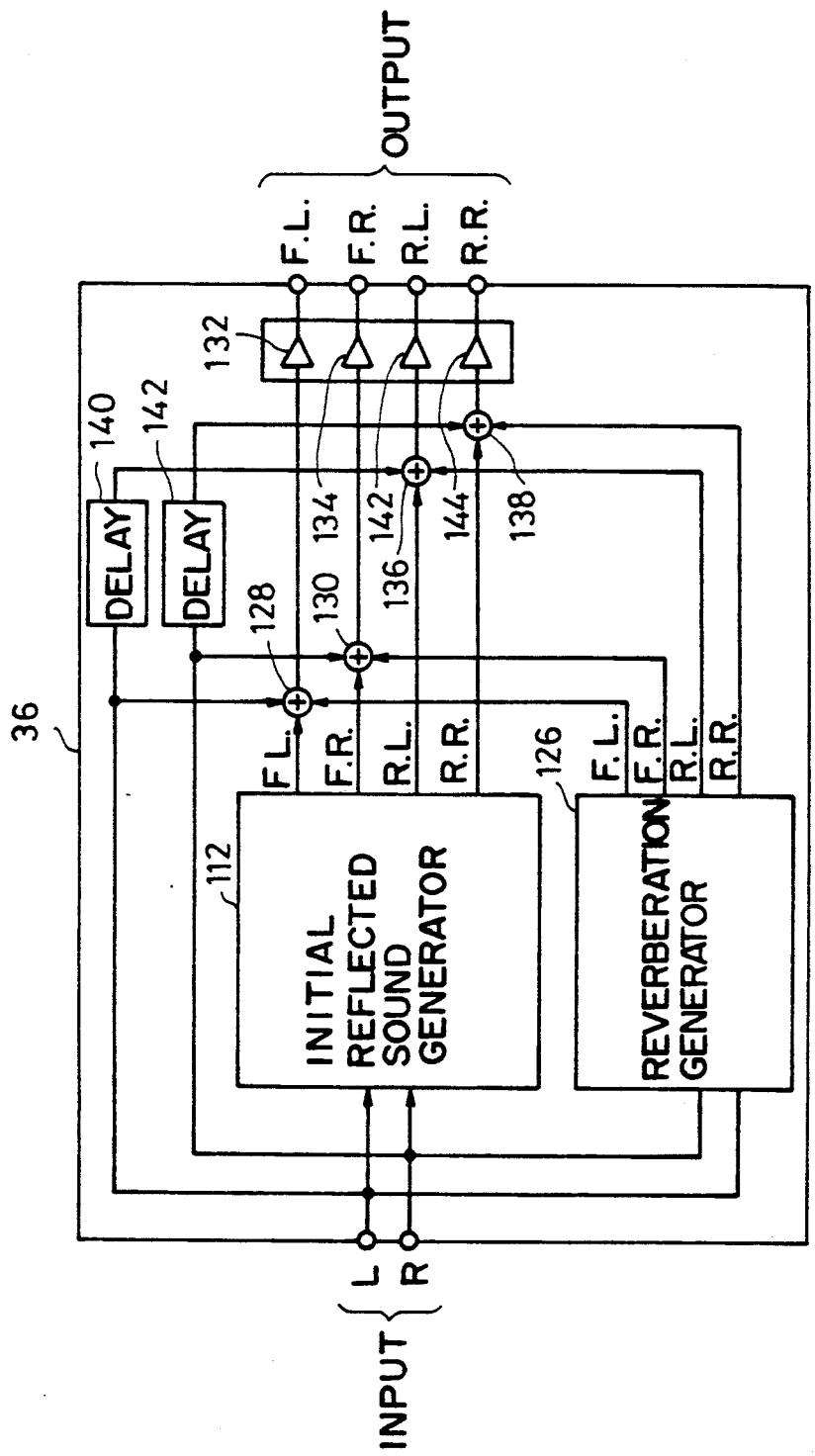
F I G. 9

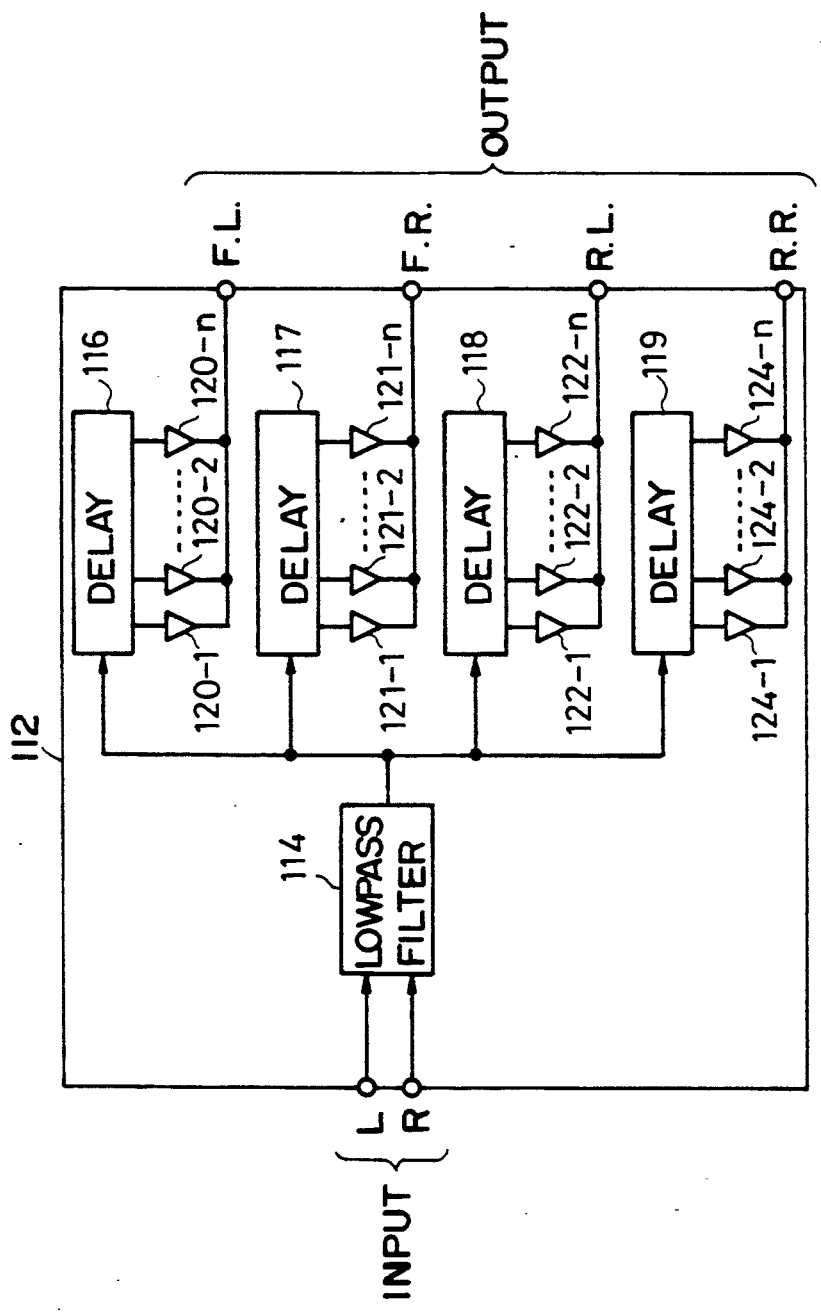
F I G. 11

AUDIO REPRODUCTION CHARACTERISTICS CONTROL DEVICE

BACKGROUND OF THE INVENTION

This invention relates to a reproduction characteristics control device for an audio device reproducing various sound fields by producing reflected sounds of a reproduced source signal and, more particularly, to a control device of this type capable of correcting a frequency-response characteristic easily to a standard frequency response characteristic or other predetermined frequency response characteristic in accordance with an actual reproduction environment, e.g., a space inside an automobile or a listening room. The invention relates further to a reproduction characteristics control device of the above described type having an improved impression of presence.

In the field of audio devices, attempts have been made to reproduce various sound fields in a selected reproduction environment, e.g., a space inside an automobile or a listening room. These attempts aim at reproducing tones in a selected reproduction environment with an atmosphere as if one was present in a real sound field such as a concert hall.

In the prior art sound field reproduction, reflected sound characteristic parameters of various reproduced sound fields are prestored in a memory such as a ROM, these reflected sound parameters are read out by a user's operation for designating a reproduced sound field and operated with a reproduced source signal to produce a reflected sound signal, and this reflected sound signal is propagated from sound field reproducing loudspeakers disposed at four corners of the reproduction environment.

An attempt has recently been made to apply the above sound field reproduction technique to an audio device mounted on an autombile so as to reproduce a desired sound field in an automobile. A frequency response characteristic in a space inside an automobile, however, is a peculiar one which is different from one in a listening room in that frequency response is generally high in a low frequency region and low in a high frequency region. The frequency response inside an automobile varies also greatly with the type of the automobile (i.e., passenger car, commerical car, station wagon etc.), size of the space inside the automobile, the number of passengers, the listener's position, characteristics and location of loudspeakers and other factors.

For obtaining a sufficient sound field reproduction effect, therefore, it is necessary in the prior art device to manipulate a graphic equalizer or the like device to correct the frequency response characteristic to a standard characteristic (i.e., a flat characteristic). This correction, however, requires an extremely troublesome operation for users.

In some sound fields to be reproduced, the sound reproduction effect can be enhanced by correcting the frequency response characteristic to a predetermined characteristic (e.g., a characteristic in which a certain frequency band is emphasized). In this case also, correction by users involves a troublesome operation.

It is, therefore, an object of the invention to provide a reproduction characteristics control device for an audio device capable of correcting a frequency characteristic easily in accordance with a reproduction environment or with a reproduction environment and a sound field to be reproduction and thereby effectively realizing reproduction of a desired sound field.

There is another problem in conventional audio devices mounted on an automobiles. In the conventional audio devices mounted on automobiles, loudspeakers are generally disposed at rear left and rear right positions in an automobile. A listener, however, cannot have a sufficient impression of presence from such loudspeaker arrangement. Besides, such loudspeaker arrangement has the disadvantage that power tends to concentrate on rear parts only.

For overcoming these probelms, various types of four channel devices have been proposed.

FIG. 12 shows an example of such prior art four channel devices. The device of FIG. 12 is one in which source signals of left and right channels are simply distributed to front loudspeakers and rear loudspeakers. In this device, source signals of left and right channels reproduced by a playback device (including, e.g., a cassette tape recorder, a tuner and a Compact Disc player) are distributed to front channels and rear channels respectively and propagated from loudspeakers 158-161 disposed at front left, front right, rear left and rear right positions in a space 156 inside of an automobile through power amplifiers 151-154.

FIG. 13 shows another example of the prior art four channel devices in which a reverberation component contained in a source signal is emphasized to produce an impression of presence in a simulating manner. In this device, source signals of left and right channels reproduced by a playback device 162 are inverted in their phase by phase inverters 164 and 166 and these phase-inverted signals and source signals which are opposite phase to each other are added to each other to produce an L-R signal and R-L signal (i.e., the reverberation component in the input source signals). These L-R and R-L signals are suitably emphasized by amplifiers 172 and 174 and are added to the source signals by adders 176 and 178. Among the sum signals, signals for front channels are propagated from loudspeakers 158 and 159 disposed at front left and front right positions in a space 156 of an automobile. The sum signals for rear channels are delayed by delay circuits 184 and 186 to produce a feeling of presence in a simulating manner and thereafter are propagated from loudspeakers 160 and 161 disposed at rear left and rear right positions in the space 156 through amplifiers 182 and 183.

FIG. 14 shows also a prior art device which produces an impression of presence by emphasizing a reverberation component contained in a source signal. For front channel sounds, source signals of left and right channels reproduced by a playback device 190 are propagated by loudspeakers 158 and 159 disposed at front left and front right positions in a space 156 of an automobile. For rear channel sounds, a right channel source signal is inverted in phase by a phase inverter 192 and added to a left channel source signal by an adder 194 to produce an L-R signal. This L-R signal is emphasized suitably by an amplifier 198, delayed by a delay circuit 202 and thereafter is propagated by a rear left loudspeaker 160 through a power amplifier 204. The L-R signal is also inverted in phase by a phase inversion circuit 206 to produce an R-L signal. This R-L signal is amplified suitably by an amplifier 208 and added to the right channel source signal by an adder 210. The sum signal is delayed by a delay circuit 212 and thereafter is propagated by a rear right loudspeaker 161 through a power amplifier 214.

The device of FIG. 12 which simply distributes source signals cannot reproduce a desired sound field and, moreover, reproduction of source sounds tends to become somewhat unnatural.

The devices of FIGS. 13 and 14 which produce presence in a simulating manner simply emphasize a reverberation component contained in a source signal and fail to reproduce a selected sound field from among various sound fields such as a concert hall, a church, a stadium etc.

It is, therefore, another object of the invention to provide a reproduction characteristics control device capable of reproducing a desired sound field in a space inside of an automobile.

SUMMARY OF THE INVENTION

The audio reproduction characteristics control device achieving the first object of the invention comprises frequency response characteristic correction parameter memory means prestoring for correcting a frequency response characteristic of a given reproduction environment to a standard frequency response characteristic or other predetermined frequency response characteristic, said frequency response characteristic correction parameter memory means prestoring frequency characteristic correction parameters, reflected sound characteristic parameter memory means for a plurality of sound fields to be reproduced prestoring reflected sound characteristic parameters, reproduction characteristics control means for imparting a predetermined frequency response characteristic and a predetermined reflected sound characteristic to an input source signal, reproduction environment designation means for designating an environment in which a sound is reproduced, reproduced sound field designation means for designating a sound field to be reproduced, and parameter selection means for selecting a frequency response characteristic correction parameter from said frequency response characteristic correction parameter memory means in accordance with at least one reproduction environment designated by said reproduction environment designation means and with the designated sound field to be reproduced and also for selecting a reflected sound characteristic parameter from said reflected sound characteristic parameter memory means in accordance with the sound field to be reproduced designated by said reproduced sound field designation means thereby to supply the selected parameters to said reproduction characteristics control means.

According to the invention, by prestoring frequency response characteristic correction parameters for correcting the frequency response characteristic which varies with the reproduction environment (e.g., in the case of an audio device mounted on an automobile, the frequency response characteristic which varies with the type of the automobile, size of the space inside the automobile, the number of passengers, the listener's position, and characteristics and location of loudspeaker used) to a standard frequency response characteristic or other predetermined frequency response characteristic, one of the frequency response characteristic correction parameters is read out in accordance with the designated reproduction environment and, if necessary, the designated sound field in addition to the designated reproduction environment whereby the frequency response characteristic is corrected by the reproduction characteristics control means. Accordingly, the frequency response characteristic can be easily corrected in accordance with the reproduction environment or the reproduction environment plus the sound field to be reproduced whereby a sufficient sound field reproduction effect can be realized.

In the reproduction characteristics control device achieving the second object of the invention, said reproduction characteristics control means comprises input means for inputting left and right channel source signals in the form of digital signals, reflected sound signal generation means for generating reflected sound signals for front left, front right, rear left and rear right positions of the designated sound field by operating the input source signals with reflected sound characteristic parameters for front left, front right, rear left and rear right positions of the designated sound field, addition means for adding the reflected sound signals for front left and front right positions generated by said reflected sound signal generation means and the source signals of the front left and front right channels together, addition means for adding the source signals of the left and right channels with the reflected sound signals for rear left and rear right positions generated by said reflected sound signal generation means together, and signal supply means for supplying the signals of front left, front right, rear left and rear right positions provided by said respective addition means for propagation by loudspeakers after digital-to-analog conversion.

According to this aspect of the invention, the reflected sound signals for front left, front right, rear left and rear right positions of a designated sound field are generated by operating input source signals with reflected sound characteristic parameters of front left, front right, rear left and rear right positions and these reflected sound signals are added to the source signals to be propagated from the front left, front right, rear left and rear right direction in the space inside of an automobile. Accordingly, an impression of presence is improved as compared with the prior art devices in which a reverberation component is emphasized to produce an impression of presence in a simulating manner.

In another aspect of the invention, the source signals are propagated from the rear left and rear right directions after being delayed by a predetermined short period of time by delay means so that orientation of direct sounds is shifted forward without causing a feeling of unnaturalness.

An embodiment of the invention will be described below with reference to the accompanying drawings.

BRIEF DESCRIPTION OF THE DRAWINGS

In the accompanying drawings,

FIG. 3 is a block diagram showing a specific example of a graphic equalizer 32 of FIG. 1;

FIG. 5 is a block diagram showing a specific example of a compressor 34 of FIG. 1;

FIG. 9 is a block diagram showing a specific example of a sound field processor 36 of FIG. 1;

FIG. 11 is a block diagram showing a specific example of an initial reflected sound generator 112 of FIG. 9.

DESCRIPTION OF THE PREFERRED EMBODIMENT

Figure 2:
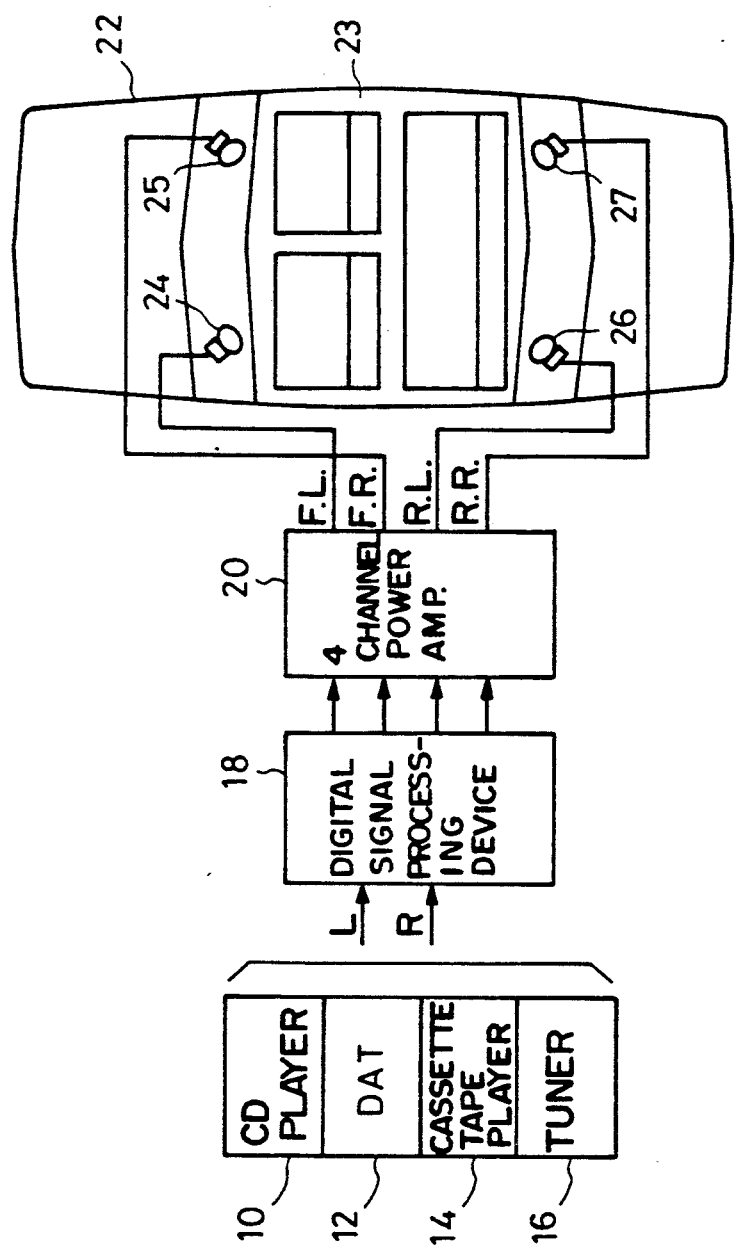
FIG. 2 is a schematic block diagram showing an audio device mounted on an automobile to which the reproduction characteristics control device according to the invention is applied.
Figure 4:
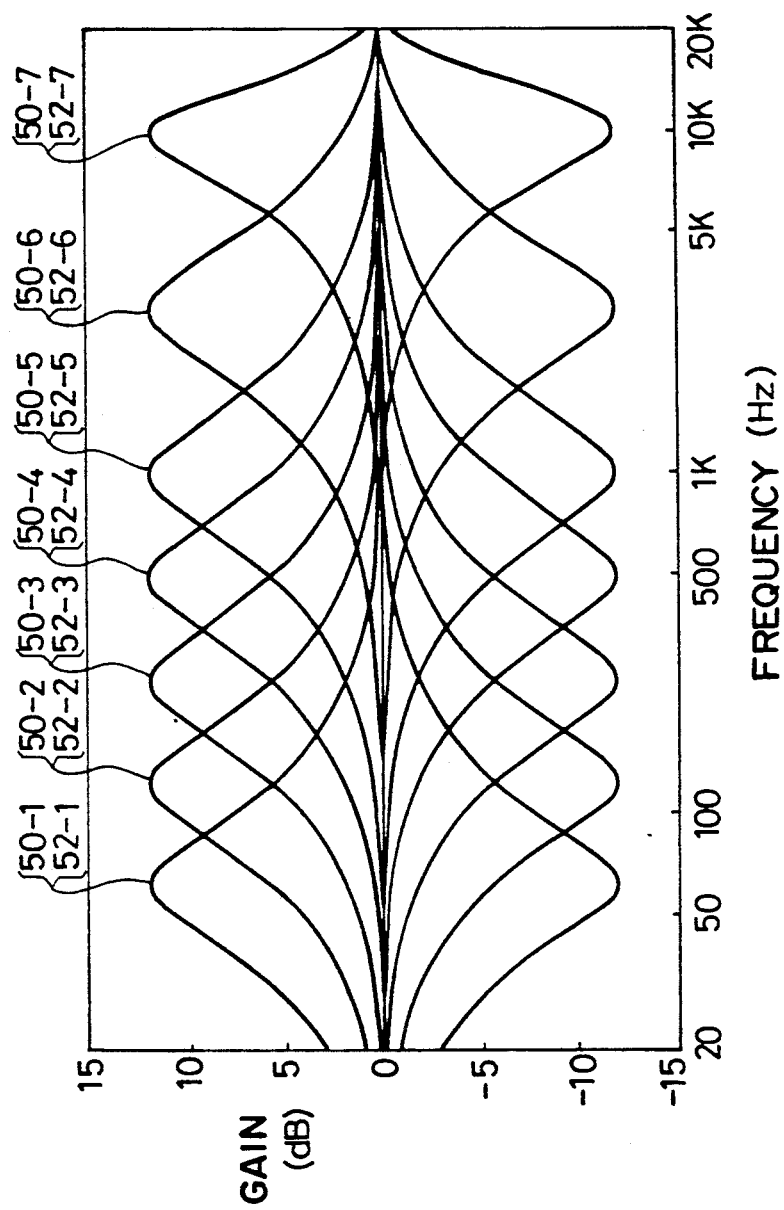
FIG. 4 is a diagram showing fundamental characteristics of the graphic equalizer of FIG. 3.

An embodiment of the invention which is applied to an audio device mounted on an automobile will now be described. FIG. 2 schematically illustrates the audio device mounted on an automobile to which the invention is applied. This audio device includes a Compact Disc player 10, a DAT (digital audio tape recorder) 12, a cassette tape recorder 14 and a tuner 16 as playback devices. Stereophonic signals reproduced from these playback devices are applied to a digital signal processing device 18. In the digital signal processing device 18, reflected sound characteristic parameters for reproducing a designated sound field and frequency response characteristic correction parameters for correcting the frequency response characteristic of the reproduction environment are stored and these parameters are read out by manipulation by a user to produce a reflected sound signal and correct the frequency response characteristic.

Four channel signals, i.e., signals of front left, front right, rear left and rear right channels are amplified by a four channel power amplifier 20 and propagated from loudspeakers 24-27 disposed at front left, front right, rear left and rear right positions in a space 23 inside of an automobile 22.

Figure 1:
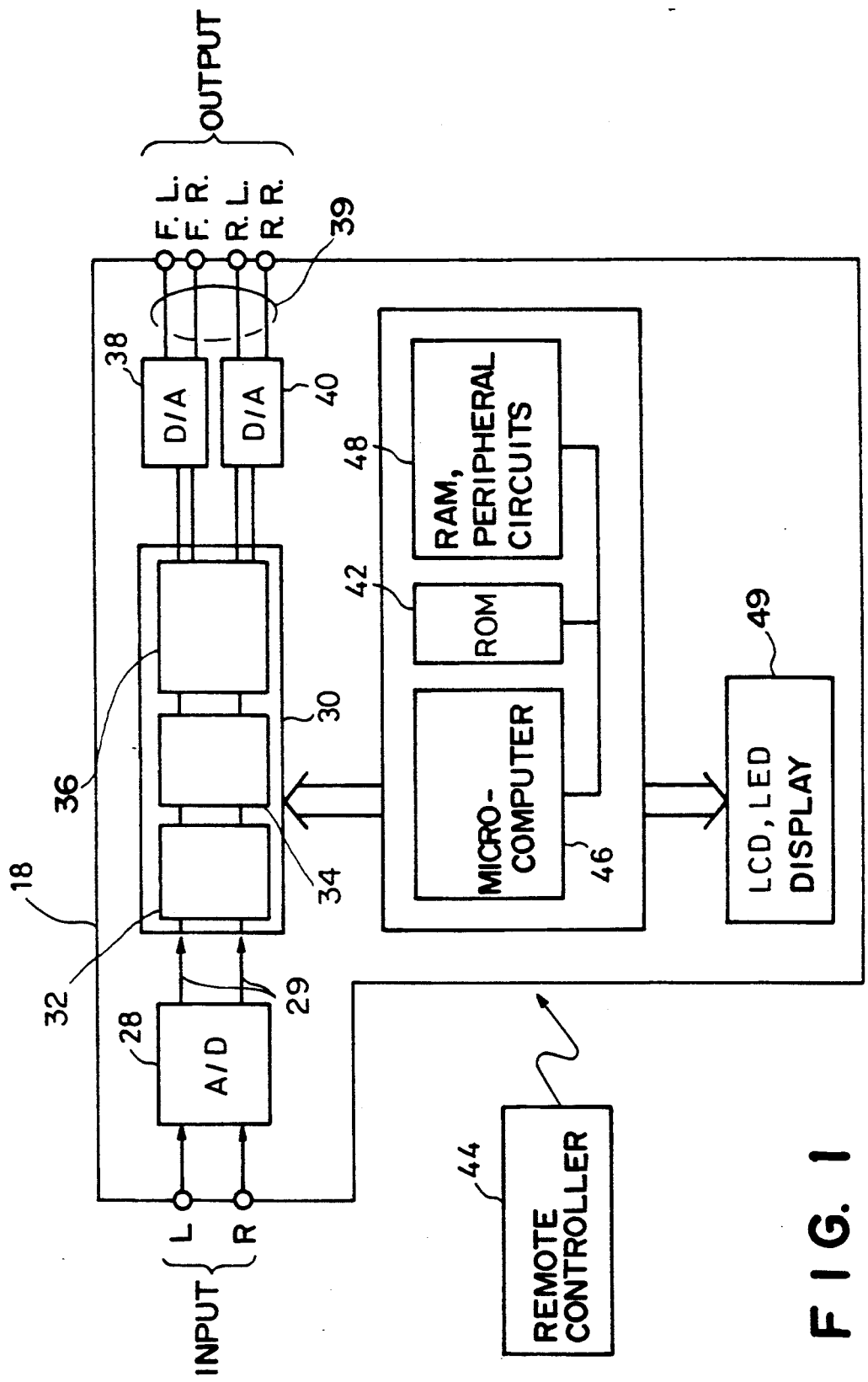
FIG. 1 is a block diagram showing a specific example of a digital signal processing device 18 of FIG. 2.

A specific example of the digital signal processing device 18 is shown in FIG. 1. In FIG. 1, input stereophonic signals applied via an input line 29 which constitutes the input means to a digital signal processor (hereinafter abbreviated as DSP) 30 which constitutes the reproduction characteristics control measn either directly (if the input signal is a digital signal) or after being converted to a digital signal by an analog-to-digital converter 28 (if the input signal is an analog signal). The DSP 30 comprises a graphic equalizer 32, a compressor 34 and a sound field processor 36. The graphic equalizer 32 imparts a designated frequency response characteristic to the input source signal. The compressor 34 compresses the dynamic range of the input source signal with a designated characteristic. The sound field processor 36 generates four channel reflected sound signals and reverberation signals for reproducing the designated sound field with respect to the input source signal. The output four channel signals from the DSP 30 are converted to analog signals by digital-to-analog converters 38 and 40 and delivered out for propagation by loudspeakers through an output line 39. The digital-to-analog converters 38 and 40 and the output line 39 constitute the signal supply means.

A ROM (read-only memory) 42 which constitutes the reflected sound characteristic parameters memory means prestores reflected sound characteristic parameters for various sound fields to be produced. The ROM 42 which also constitutes the frequency response characteristic correction parameter memory means prestores frequency response characteristic correction parameters for correcting frequency response characteristics of various reproduction environments to a standard frequency response characteristic or other predetermined frequency response characteristic (e.g., a frequency response characteristic in which a certain frequency band is emphasized).

A remote controller 44 is provided for remote controlling the playback devices 10, 12, 14 and 16 and also for designating, as the reproduction environment designation means, a reproduction environment in which a sound is actually reproduced by means of keys each representing a reproduction environment or the like means. The remote controller 44 also functions as the reproduced sound field designation means which designates a sound field to be reproduced by means of keys each representing one of various sound fields or the like means.

A microcomputer 46 which constitutes the parameter selection means accesses the ROM 42 to read out necessary parameters in response to manipulation of the remote controller 44. If, for example, a reproduction environment has been designated, a corresponding frequency response characteristic correction parameter is read from the ROM 42 and the frequency response characteristic of the graphic equalizer 32 is thereby established. If a sound field to be reproduced has been designated, a corresponding reflected sound characteristic parameter is read from the ROM 42 and the reflected sound characteristic of the sound field processor 36 is thereby established. There is also a case where it is desirable to correct the frequency response characteristic in accordance with a sound field to be reproduced. Accordingly, a frequency response characteristic correction parameter may be read from the ROM 42 in accordance with a combination of designation of a reproduction environment and designation of a sound field to be reproduced. Alternatively, a plurality of reproduction environments may be previously combined with a single sound field to be reproduced and one of such combinations may be read out by manipulation of a single key.

In the remote controller 44, the reflected sound characteristic parameters and the frequency response characteristic parameters may be manually adjusted. The manually adjusted parameters may be stored in a RAM 48 so that these parameters may be read out when necessary as a user's program.

A display device 49 is made of LCDs (liquid crystals) or LEDs (light-emitting diodes) and displays a designated sound field with letters. The display device 49 displays also a designated reproduction environment with a reproduction environment number or a characteristic graph representing a reproduced frequency response characteristic.

Description will now be made about a specific example of the DSP 30 of FIG. 1. FIG. 3 shows a specific example of the graphic equalizer 32. This graphic equalizer 32 has left and right channel systems 50 and 52 independently for the left and right channels. The systems 50 and 52 respectively include seven secondary IIR (circulating type) digital filters 50-1 through 50-7 and 52-1 through 52-7 in which the entire frequency region is divided in seven frequency bands (center frequencies are 65 Hz, 125 Hz, 250 Hz, 500 Hz, 1 kHz, 3 kHz and 10 kHz) and which are connected in series. Frequency response characteristics of the respective filters 50-1 through 50-7 and 52-1 through 52-7 are established within a range of, e.g., 2 dB step plus or minus 12 dB in response to frequency response characteristic correction parameters read from the ROM 42 (FIG. 2).

Reproduced left and right channel signals are adjusted in their input level by level adjusters 54 and 56 and thereafter are imparted with frequency response characteristics by the IIR digital filters 50-1 through 50-7 and 52-1 through 52-7 and delivered out through coefficient multipliers 58 and 60 and adders 62 and 64. Lines 66 and 67 are bypasses for passing an input signal straightly to the adders 62 and 64 through coefficient multipliers 68 and 70. The coefficient multipliers 58, 60, 68 and 70 are provided for switching on and off the function of the graphic equalizer 32. When the function of the graphic equalizer 32 is to be switched on, the coefficient of the coefficient multipliers 58 and 60 is set at 1 and the coefficient of the coefficient multipliers 68 and 70 is set at 0. When the function of the graphic equalizer 32 is to be switched off, the coefficient of the coefficient multipliers 58 and 60 is set at 0 and the coefficient of the coefficient multipliers 68 and 70 is set at 1.

Figure 6:
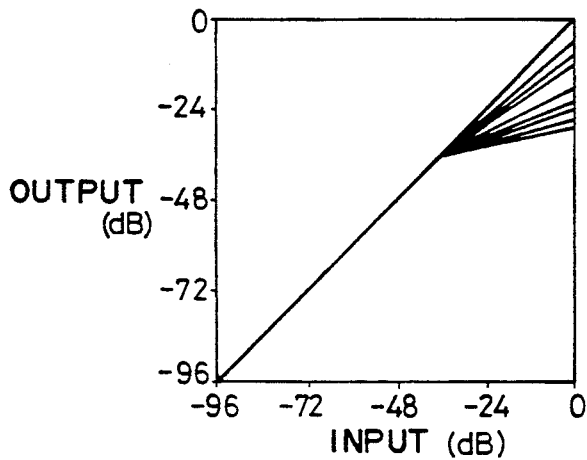
FIGS. 6, 7 and 8 are graphs showing characteristics of the compressor 34 of FIG. 5.
Figure 7:
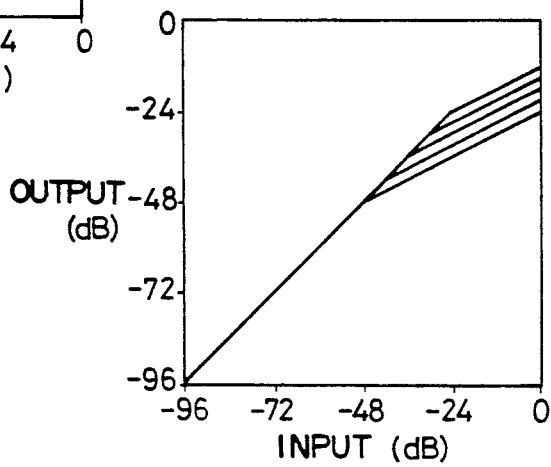
Figure 8:
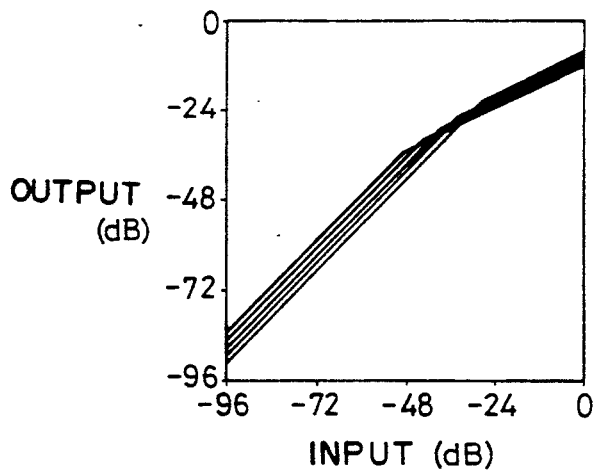

FIG. 5 shows a specific example of the compressor 34. The left and right channel signals provided by the graphic equalizer 32 are applied to amplifiers 82 and 84 through lines 86 and 88. Circuits of lines 90 and 92 are provided for controlling gains of the amplifiers 82 and 84 in response to the input signals. More specifically, the left and right channel signals are removed in their dc components by DC cut circuits 72 and 74, rectified by rectifying circuits 76 and 78 and thereafter are applied to a control circuit 80. The control circuit 80 controls various factors including a dynamic range compression ratio, threshold level, attack time and release time by setting operation such as remote control operation by the user. Gains of the amplifiers 82 and 84 are controlled in accordance with the contents set by the setting operation. FIG. 6 shows an example of input-output characteristic in the case of changing the dynamic range within a range of 1.0 to 5.0 while maintaining the threshold level at −36 dB. FIG. 7 shows an example of input-output characteristic in the case of changing the threshold level within the range of −24 dB to −48 dB while maintaining the dynamic range compression ratio at 2:1. FIG 8 shows an example of input-output characteristic in the case of changing the threshold level within a range of −24 dB to −48 dB and also changing the output gain within a range of 5 dB to 13 dB while maintaining the dynamic range compression ratio at 2:1. In a case where the compressor 34 is used for preventing occurrence of a noise, the characteristic of FIG. 8 having a gain on the output side is preferably used.

The outputs of the amplifiers are delivered out through coefficient multipliers 98 and 100 and adders 102 and 104. Lines 106 and 107 are bypasses for passing the input signals straightly to the adders 102 and 104 through coefficient multipliers 108 and 110. The coefficient multipliers 98, 100, 108 and 110 are provided for switching on and off the function of the compressor 34. When the function of the compressor 34 is to be switched on, the coefficient of the coefficient multipliers 98 and 100 is set at 1 and the coefficient of the coefficient multipliers 108 and 110 is set at 0. When the function of the compressor 34 is to be switched off, the coefficient of the coefficient multipliers 98 and 100 is set at 0 and the coefficient of the coefficient multipliers 108 and 11 is set at 1.

Figure 10A:
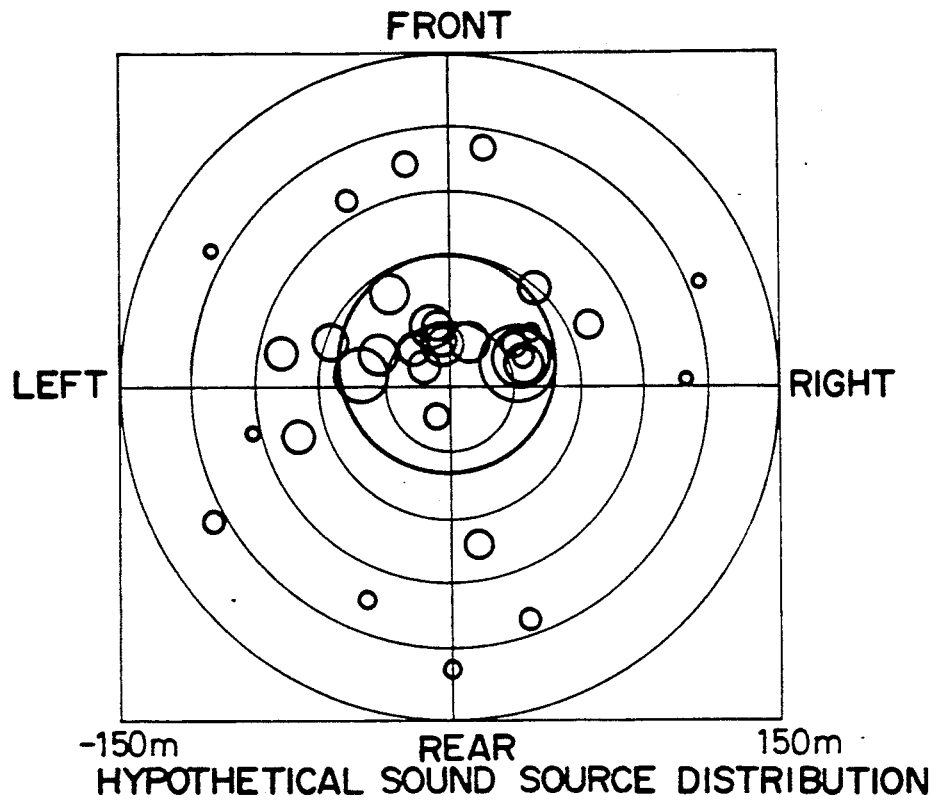
FIGS. 10a and 10b are diagrams showing an example of hypothetical sound source distribution used for generation of reflected sounds and an example of reflected sound characteristic parameter in one direction.
Figure 10B:
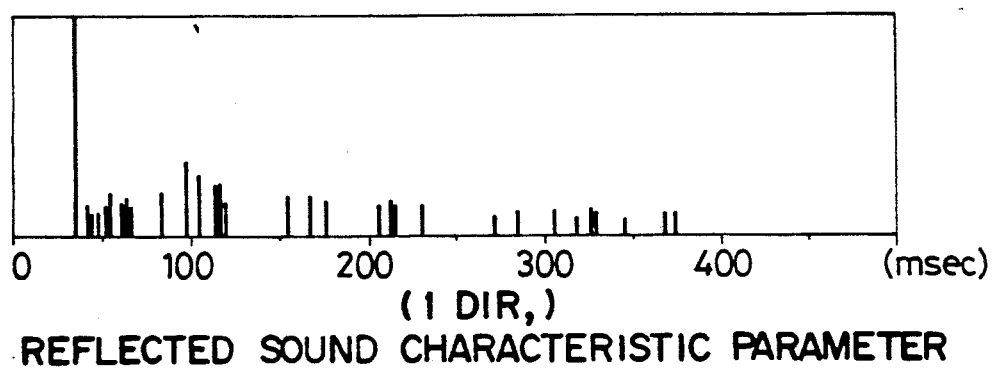
Figure 12:
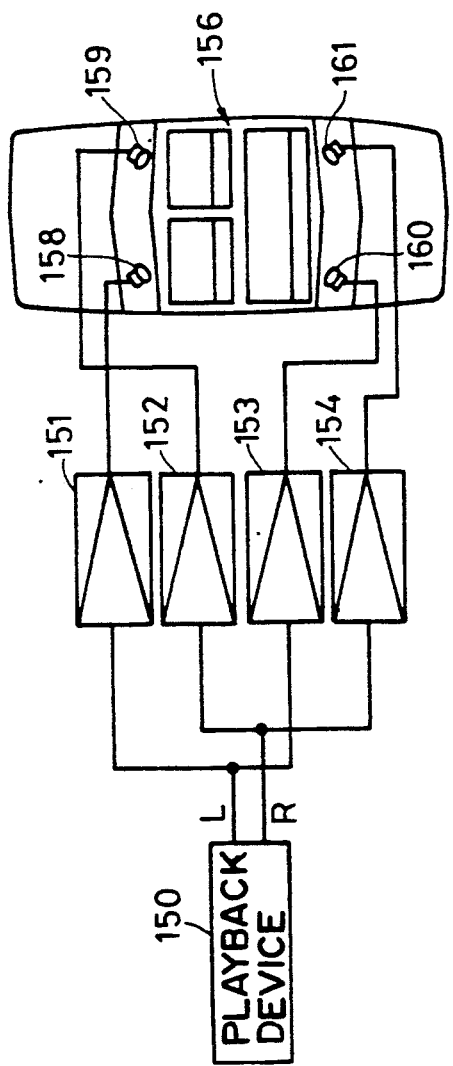
FIGS. 12, 13 and 14 are block diagrams showing examples of the prior art devices.
Figure 13:
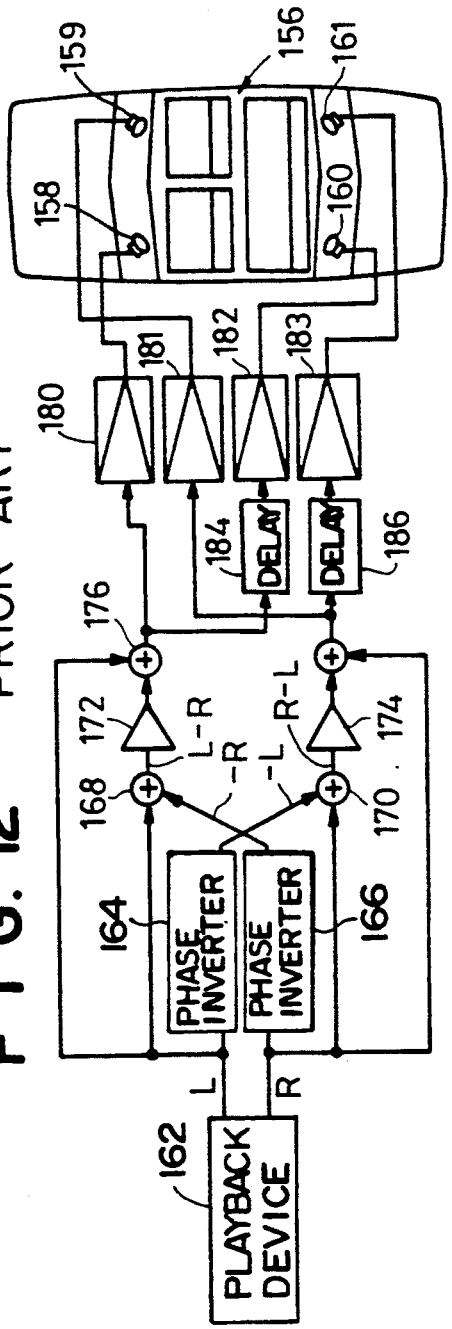
Figure 14:
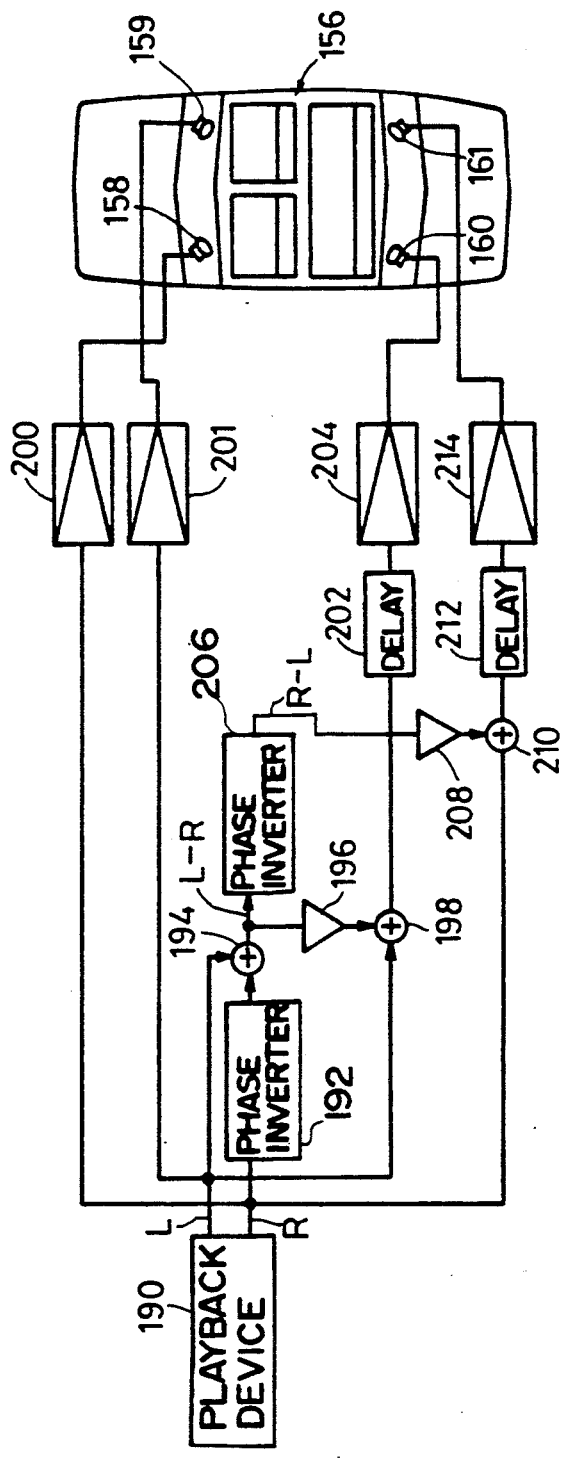

A specific example of the sound field processor 36 is shown in FIG. 9. The left and right channel signals provided by the compressor 34 are applied to an initial reflected sound generator 112. The initial reflected sound generator 112 generates initial reflected sound signals in accordance with the reflected sound characteristic parameters read from the ROM 42 (FIG. 1). As the reflected sound characteristic parameters, reflected sound data which have been measured in actual sound fields such as a concert hall, a church and a stadium may be used. For obtaining such reflected sound data, an impulse signal is issued in an actual sound field and multiple initial reflected sound groups arriving from all directions to a listening point are collected by a four point microphone located at the listening point and a hypothetical sound source distribution such as shown in FIG. 10 is obtained on the basis of the collected data. In FIG. 10, the center represents the listening point (i.e., position of the microphone), each circle represents a position of a hypothetical sound source and the size of each circle represents its power level. A reflected sound characteristic parameter as shown in FIG. 10 is obtained on the basis of this hypothetical sound source distribution with respect to each of four directions of front left, front right, rear left and rear right directions and these parameters are stored in the ROM 42. This operation is performed for each of various sound fields. Upon designation of a sound field by the remote control operation, reflected sound characteristic parameters of four directions, i.e., front left, front right, rear left and rear right directions, are read from the ROM 42. The initial reflected sound generator 112 operates these reflected sound characteristic parameters of four directions with the source signals to produce initial reflected sound signals of four directions. Orientation of reflected sounds can be established by propagating these reflected sound signals from the loudspeakers 24-27 of four directions (FIG. 2) in the automobile.

A specific example of the initial reflected sound generator 112 is shown in FIG. 11. Left and right channel input signals are added to or subtracted from each other by a low-pass filter 114 and unnecessary high frequency components are removed and thereafter are applied to delay circuits 116-119. The delay circuits 116-119 imparts delay time to reflected sound characteristic parameters with respect to each of four directions. To output taps of the delay circuits 116-119 are connected coefficient multipliers 120-1 through 120-n, . . . 124-1 through 124-n. By setting coefficients of these coefficient multipliers to values corresponding to reflected sound levels at respective delay times of the reflected sound characteristic parameters read from the ROM 42, components of each direction of the initial reflected sounds can be obtained.

In FIG. 9, a reverberation generator 126 which constitutes the reverberation generation means is constructed of a comb filter and cascade-connected all pass filters. The provision of the reverberation generator 126 is effective for reproducing a sound field such as a church which has a prolonged reverberation sound. In the case of sound fields such as a concert hall and a live house in which reverberation contained in a source signal is sufficient, the initial reflected sound only may be generated without generating reverberation.

In FIG. 9, adders 128 and 130 add front left and front right initial reflected sound signals and front left and front right reverberation sound signals to left and right channel source signals. Resulting sum signals of the front left and front right channels are delivered out through buffer amplifiers 132 and 134.

Adders 136 and 138 add signals obtained by delaying the left and right channel source signals by delay circuits 140 and 142, rear left and rear right initial reflected sound signals and rear left and rear right reverberation signals together. The reason for adding the signals obtained by delaying the left and right channel source signals by the delay circuits 140 and 142 is that forward orientation of sounds can be achieved by utilizing the Haworth effect while averaging the energy of the field. More specifically, orientation of a sound becomes unnatural in a case, as in the prior art four channel stereophonic equipment mounted on an automobile, reproduced sounds are simply distributed to front and rear channels. In contrast thereto, by delaying the source signals by the delay circuits 140 and 142, there arises a slight time difference between a direct sound arriving from the front direction and a direct sound arriving from the rear direction. According to the Haworth effect, if the two same sounds reach the human hearing at different times, the human hearing senses the direction of a sound which has reached first as the direction of the sound source. The direct sound from the front direction therefore substantially predominates the sound field and the orientation of the sound is shifted forwardly and a natural sound field can thereby be obtained. In this case, the energy of the field becomes averaged.

Since the additions by the adders 136 and 138 are made after the source signals have been delayed by the delay circuits 140 and 142, reflected sound signal and reverberation signal components are not affected by the delaying operation so that a sound field of a high quality can be realized.

As to the sounds from the rear directions, it is also possible to switch on and off source signals (direct sound signals).

The rear left and rear right channel sum signals provided by the adders 136 and 138 are delivered out through buffer amplifiers 142 and 144.

In the above described embodiment, the invention has been applied to an audio device mounted on an automobile. The invention is applicable also to an ordinary audio device used in a listening room etc.

We claim:

1. An audio reproduction characteristics control device comprising:
    frequency response characteristic correction parameter memory means for prestoring frequency response characteristic correction parameters for correcting a frequency response characteristic of a given reproduction environment to a standard frequency response characteristic or other predetermined frequency response characteristic;
    reflected sound characteristic parameter memory means for prestoring reflected sound characteristic parameters for a plurality of sound fields to be reproduced;
    reproduction characteristics control means for imparting a predetermined frequency response characteristic and a predetermined reflected sound characteristic to an input source signal;
    reproduction environment designation means for designating an environment in which a sound is reproduced;
    reproduced sound field designation means for designating a sound field to be reproduced;
    parameter selection means for selecting a frequency response characteristic correction parameter from said frequency response characteristic correction parameter memory means in accordance with either or both of the reproduction environment designated by said reproduction environment designation means and with the designated sound field to be reproduced, and also for selecting a reflected sound characteristic parameter from said reflected sound characteristic parameter memory means in accordance with the sound field to be reproduced designated by said reproduced sound field designation means thereby to supply the selected parameters to said reproduction characteristics control means.

2. A reproduction characteristics control device as defined in claim 1 wherein said reproduction characteristics control means comprises a graphic equalizer imparting the designated frequency response characteristic to an input source signal, a compressor for compressing dynamic range of an output signal of said graphic equalizer with the designated frequency response characteristic and a sound field processor producing reflected sound signals for reproducing the designated sound field by processing an output signal of said compressor.

3. A reproduction characteristics control device as defined in claim 1 wherein said reproduction environment designation means and said reproduced sound field designation means consist of a remote controller.

4. A reproduction characteristics control device as defined in claim 1 wherein said frequency response characteristic correction parameter memory means and said reflected sound characteristic parameter memory means consist of a ROM.

5. A reproduction characteristics control device as defined in claim 1 wherein said reproduction environment is a space inside of an automobile.

6. A reproduction characteristics control device as defined in claim 1 wherein said reproduction characteristics control means comprises:
    input means for inputting left and right channel source signals in the form of digital signals;
    reflected sound signal generation means for generating reflected sound signals for front left, front right, rear left and rear right positions of the designated sound field by operating the input source signals with reflected sound characteristic parameters for front left, front right, rear left and rear right positions of the designated sound field;
    addition means for adding the reflected sound signals for front left and front right positions generated by said reflected sound signal generation means and the source signals of the front left and front right channels together;
    addition means for adding the source signals of the left and right channels with the reflected sound signals for rear left and rear right positions generated by said reflected sound signal generation means together; and
    signal supply means for supplying the signals of front left, front right, rear left and rear right positions provided by said respective addition means for propagation by loudspeakers after digital-to-analog conversion.

7. A reproduction characteristics control device as defined in claim 6 wherein said reproduction characteristics control means further comprises reverberation signal generation means for generating a reverberation sound signal and said respective addition means add the reverberation sound signal generated by said reverberation sound signal generation means to the source signals and the reflected sound signals of the respective positions.

8. A reproduction characteristics control device as defined in claim 6 wherein said reproduction characteristics control means further comprises delay means for delaying the left and right channel source signals to be supplied to said addition means for the signals of the rear left and rear right positions.

9. A reproduction characteristics control device as defined in claim 6 wherein said reproduction environment is a space inside of an automobile.

10. A reproduction characteristics control device as defined in claim 1, wherein said reproduced sound field designation means designates a sound field having characteristics based on a hypothetical sound distribution, wherein said hypothetical sound distribution is capable of being realized by a plurality of loudspeakers.

* * * * *